US010326012B2

(12) United States Patent
Watanabe et al.

(10) Patent No.: US 10,326,012 B2
(45) Date of Patent: Jun. 18, 2019

(54) NITRIDE SEMICONDUCTOR DEVICE

(71) Applicant: TOYOTA JIDOSHA KABUSHIKI KAISHA, Toyota-shi, Aichi (JP)

(72) Inventors: Atsushi Watanabe, Toyota (JP); Hiroyuki Ueda, Nagakute (JP); Tomohiko Mori, Nagakute (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 76 days.

(21) Appl. No.: 15/855,261

(22) Filed: Dec. 27, 2017

(65) Prior Publication Data

US 2018/0233591 A1  Aug. 16, 2018

(30) Foreign Application Priority Data

Feb. 15, 2017  (JP) .................................. 2017-026148

(51) Int. Cl.
*H01L 29/06* (2006.01)
*H01L 29/10* (2006.01)
(Continued)

(52) U.S. Cl.
CPC ...... *H01L 29/7788* (2013.01); *H01L 29/0657* (2013.01); *H01L 29/1045* (2013.01);
(Continued)

(58) Field of Classification Search
CPC ............ H01L 29/7788; H01L 29/0657; H01L 29/205; H01L 29/2003; H01L 29/1045; H01L 29/7783; H01L 29/7802

USPC ... 257/76, 77, 139, 194, 328, 329, 330, 332, 257/E29.021, E29.084, E29.089, E29.118, 257/E29.133, E29.246, E27.06, E27.068, 257/E21.09, E21.345, E21.403, E21.41, 257/E21.417; 438/138, 172, 270, 316, 438/478
See application file for complete search history.

(56) References Cited

U.S. PATENT DOCUMENTS 8,916,880 B2 * 12/2014 Ohtsuka ............ H01L 21/02447
257/77
2007/0045727 A1  3/2007 Shiraishi et al.
(Continued)

FOREIGN PATENT DOCUMENTS

JP  2007-059636 A  3/2007

*Primary Examiner* — Dao H Nguyen
(74) *Attorney, Agent, or Firm* — Oliff PLC

(57) ABSTRACT

A semiconductor device includes a semiconductor substrate, a source electrode, a drain electrode, and a gate electrode disposed on the semiconductor substrate via a gate insulator film. The semiconductor substrate includes a first portion constituted of GaN and a second portion constituted of $Al_xGa_{(1-x)}N$ ($0<x\leq1$). The first portion includes an n-type source region being in contact with the source electrode, an n-type drain region being in contact with the drain electrode, a p-type body region intervening between the source region and the drain region and being in contact with the source electrode, and an n-type drift region intervening between the body region and the drain region and having a carrier density that is lower than a carrier density of the drain region. The second portion includes a barrier region being in contact with each of the source electrode, the body region and the drift region.

6 Claims, 3 Drawing Sheets

(51) Int. Cl.
*H01L 29/20* (2006.01)
*H01L 29/78* (2006.01)
*H01L 29/205* (2006.01)
*H01L 29/417* (2006.01)
*H01L 29/778* (2006.01)

(52) U.S. Cl.
CPC ........ *H01L 29/2003* (2013.01); *H01L 29/205* (2013.01); *H01L 29/41766* (2013.01); *H01L 29/7783* (2013.01); *H01L 29/7802* (2013.01); *H01L 29/7803* (2013.01)

(56) References Cited

U.S. PATENT DOCUMENTS

| | | | | |
|---|---|---|---|---|
| 2008/0166845 | A1* | 7/2008 | Darwish | H01L 29/0649 438/270 |
| 2009/0050932 | A1* | 2/2009 | Lu | H01L 21/84 257/139 |
| 2009/0267078 | A1* | 10/2009 | Mishra | H01L 29/2003 257/76 |
| 2014/0284700 | A1* | 9/2014 | Nozu | H01L 29/7813 257/328 |
| 2017/0012118 | A1* | 1/2017 | Park | H01L 29/7802 |
| 2018/0102435 | A1* | 4/2018 | Hebert | H01L 29/0623 |

\* cited by examiner

NITRIDE SEMICONDUCTOR DEVICE

TECHNICAL FIELD

A technique disclosed herein relates to a nitride semiconductor device.

Japanese Patent Application Publication No. 2007-59636 discloses a semiconductor device that includes a GaN (gallium nitride) semiconductor substrate. This semiconductor substrate has an element structure of a MOSFET (Metal-Oxide-Semiconductor Field-Effect Transistor) formed therein. Specifically, the semiconductor substrate is provided with an n-type source region being in contact with a source electrode, an n-type drain region being in contact with a drain electrode, a p-type body region intervening between the source region and the drain region and being in contact with the source electrode, and an n-type drift region intervening between the body region and the drain region and having a carrier density that is lower than a carrier density of the drain region. Further, a gate electrode faces a part of the body region located between the source region and the drift region, via a gate insulator film. This semiconductor device is configured such that, when a drive voltage is applied to between the gate electrode and the source electrode, an n-type channel that extends between the source region and the drift region is formed.

SUMMARY

Each of GaN and SiC (silicon carbide) is a semiconductor material that has a wide band gap larger than a wide band gap of Si (silicon). Such a semiconductor material is referred to as a wide-band-gap semiconductor, and is being applied to semiconductor devices as a semiconductor material alternative to Si. However, when GaN is compared with SiC, GaN has a thermal conductivity lower than a thermal conductivity of SiC. Therefore, in a semiconductor device including GaN, when its semiconductor substrate (i.e., GaN) generates heat due to energization, the heat in the semiconductor substrate is less likely to be dissipated sufficiently, and as a result of which the semiconductor substrate may be overheated. To prevent overheating of the semiconductor substrate, a possible measure is to restrict a current that flows through the semiconductor substrate. Such a measure, however, fails to exploit advantage of GaN (e.g., loss reduction due to a decrease in size of the drift region).

In consideration of the matters described above, the disclosure herein provides a technique capable of improving a heat-dissipating performance of a semiconductor substrate including GaN.

The present teachings may provide a semiconductor device. The semiconductor device may comprise: a semiconductor substrate comprising a nitride semiconductor; a source electrode and a drain electrode each disposed on the semiconductor substrate; and a gate electrode disposed on the semiconductor substrate via a gate insulator film. The semiconductor substrate includes a first portion constituted of GaN and a second portion constituted of $Al_xGa_{(1-x)}N$ ($0<x\leq1$). The first portion includes an n-type source region being in contact with the source electrode, an n-type drain region being in contact with the drain electrode, a p-type body region intervening between the source region and the drain region and being in contact with the source electrode, and an n-type drift region intervening between the body region and the drain region and having a carrier density that is lower than a carrier density of the drain region. The second portion includes a barrier region being in contact with each of the source electrode, the body region and the drift region.

In the semiconductor substrate, heat generation accompanying energization is mainly caused in the drift region. Since the drift region is constituted of GaN, heat in the drift region is less likely to be dissipated to an outside. In this respect, in the configuration described above, the barrier region constituted of $Al_xGa_{(1-x)}N$ is in contact with both of the drift region and the source electrode. $Al_xGa_{(1-x)}N$ has a thermal conductivity higher than a thermal conductivity of GaN. For example, GaN has a thermal conductivity of 1.30 W/(cm·K), whereas AlN (i.e., x=1) has a thermal conductivity of 2.85 W/(cm·K). Accordingly, the heat generated in the drift region is quickly transferred to the source electrode through the barrier region, and thereby, overheating of the semiconductor substrate is prevented or suppressed.

Additionally, according to the configuration described above, a two-dimensional hole gas is generated at an interface between the barrier region constituted of $Al_xGa_{(1-x)}N$ and the body region constituted of p-type GaN. Due to this, when a high electric field is applied to the drift region and impact ionization occurs in the drift region for example, holes generated by the impact ionization are quickly discharged to the source electrode through the two-dimensional hole gas. An avalanching increase in impact ionization is thereby suppressed, and an avalanche resistance of the semiconductor device is improved.

Furthermore, according to the configuration described above, a two-dimensional electron gas is generated at an interface between the barrier region constituted of $Al_xGa_{(1-x)}N$ and the drift region constituted of n-type GaN. Electron mobility is high in the two-dimensional electron gas, and hence when electrons flow from the source electrode to the drain electrode through the drift region, an energy loss caused in the drift region is reduced. Accordingly, an on-resistance of the semiconductor device is reduced, and an amount of heat generated in the drift region is also reduced.

DETAILED DESCRIPTION

Figure 1:
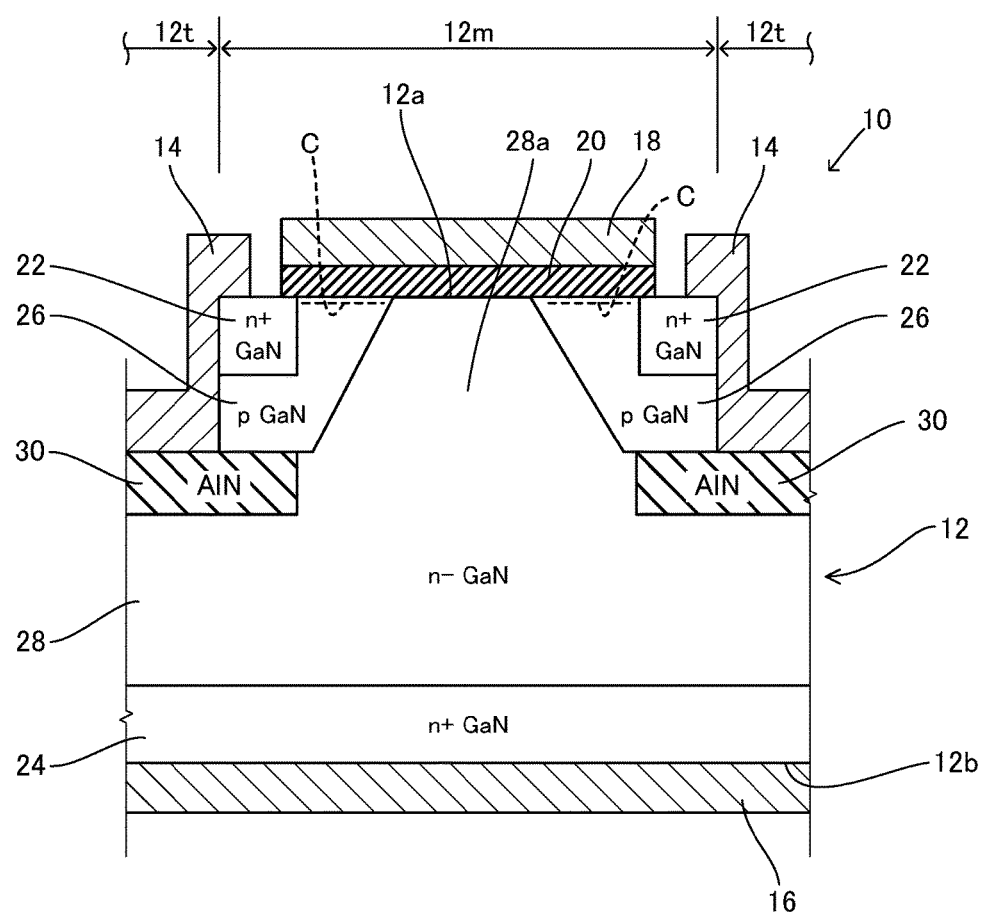
FIG. 1 schematically shows a configuration of a semiconductor device 10 of an embodiment.

In an embodiment of the technique disclosed herein, $Al_xGa_{(1-x)}N$ that constitutes a second portion (i.e. a barrier region) of a semiconductor device may be AlN (aluminum nitride). In other words, X=1 may be satisfied. $Al_xGa_{(1-x)}N$ with a higher content rate of Al (aluminum) has a higher thermal conductivity. Accordingly, in order to enhance a heat-dissipating performance by the barrier region, it is preferable to increase a content rate of Al in the barrier region. AlN, in particular, has a high thermal conductivity with which a sufficient heat-dissipating performance can be realized.

In an embodiment of the technique disclosed herein, a semiconductor substrate may comprise a first surface at which each of a source region, a body region, and a drift region is disposed. Further, a gate electrode may face a part of the body region extending between the source region and the drift region at the first surface via a gate insulator film.

Thereby the semiconductor device can comprise a planar-type gate structure. As another embodiment, the semiconductor device may comprise another gate structure such as a trench-type gate structure.

In the embodiment described above, the semiconductor substrate may further comprise a second surface at which the drain region is disposed, and being located opposite to the first surface. Further, a source electrode may be disposed on the first surface and a drain electrode may be disposed on the second surface. Thereby, the semiconductor device can comprise a vertical MOSFET structure. As another embodiment, the semiconductor device may comprise a horizontal MOSFET structure by allowing both of the source electrode and the drain electrode to be located on a same side of the semiconductor substrate.

Representative, non-limiting examples of the present invention will now be described in further detail with reference to the attached drawings. This detailed description is merely intended to teach a person of skill in the art further details for practicing preferred aspects of the present teachings and is not intended to limit the scope of the invention. Furthermore, each of the additional features and teachings disclosed below may be utilized separately or in conjunction with other features and teachings to provide improved nitride semiconductor devices, as well as methods for using and manufacturing the same.

Moreover, combinations of features and steps disclosed in the following detailed description may not be necessary to practice the invention in the broadest sense, and are instead taught merely to particularly describe representative examples of the invention. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

With reference to the drawings, a semiconductor device 10 of an embodiment will be described. The semiconductor device 10 is a nitride semiconductor device that includes a nitride semiconductor. The semiconductor device 10 is a type of power semiconductor device, and can be adopted as an inverter or a converter in, for example, a power supply circuit for a motor that drives a vehicle. It should be noted that application of technical elements described in the present embodiment is not limited to the semiconductor device 10 of the present embodiment, and the technical elements can also be applied to a variety of other semiconductor devices.

FIG. 1 shows a unit structure of the semiconductor device 10. In the semiconductor device 10, the unit structure shown in FIG. 1 is repeatedly provided along a left-and-right direction in FIG. 1. As shown in FIG. 1, the semiconductor device 10 includes a semiconductor substrate 12, a source electrode 14 and a drain electrode 16 each disposed on the semiconductor substrate 12, and a gate electrode 18 disposed on the semiconductor substrate 12 via a gate insulator film 20.

The semiconductor substrate 12 is a so-called nitride semiconductor substrate, and at least a part of the semiconductor substrate 12 includes a nitride semiconductor, as described later. The semiconductor substrate 12 includes an upper surface 12a and a lower surface 12b located opposite to the upper surface 12a. The upper surface 12a is an example of a first surface in the present disclosure, and the lower surface 12b is an example of a second surface in the present disclosure. As an example, the upper surface 12a can include a mesa portion 12m, and trench portions 12t located on both sides of the mesa portion 12m. The mesa portion 12m protrudes with respect to each of the trench portions 12t. In other words, each of the trench portions 12t is depressed with respect to the mesa portion 12m, and is located between two of the mesa portions 12m that are adjacent to each other.

The source electrode 14 is located on the upper surface 12a of the semiconductor substrate 12. As an example, the source electrode 14 is disposed in the trench portion 12t, and has its both ends located on the mesa portions 12m, respectively. Meanwhile, the drain electrode 16 is located on the lower surface 12b of the semiconductor substrate 12. In other words, the semiconductor device 10 of the present embodiment is a vertical semiconductor device in which the source electrode 14 and the drain electrode 16 are respectively distributed to the both sides of the semiconductor substrate 12. As another embodiment, the semiconductor device 10 may be a horizontal semiconductor device in which the source electrode 14 and the drain electrode 16 are provided on a same side of the semiconductor substrate 12. Each of the source electrode 14 and the drain electrode 16 is constituted of a conductive material. Although not particularly limited, the material of each of the source electrode 14 and the drain electrode 16 may be a metal material such as aluminum or an aluminum alloy. Moreover, each of the source electrode 14 and the drain electrode 16 may be constituted of a single material, or may include a laminated structure constituted of different materials. The source electrode 14 and the drain electrode 16 can be formed, for example, by sputtering.

The gate electrode 18 and the gate insulator film 20 are located on the upper surface 12a of the semiconductor substrate 12, and the gate electrode 18 faces the upper surface 12a of the semiconductor substrate 12 via the gate insulator film 20. As an example, the gate electrode 18 and the gate insulator film 20 are disposed on the mesa portion 12m, and the gate electrode 18 faces the mesa portion 12m via the gate insulator film 20. The gate electrode 18 is constituted of a conductive material, and the gate insulator film 20 is constituted of an insulating material. Although not particularly limited, the material of the gate electrode 18 may be polycrystalline silicon, and the material of the gate insulator film 20 may be silicon oxide. The gate electrode 18 and the gate insulator film 20 can be formed, for example, by CVD (Chemical Vapor Deposition). As such, the semiconductor device 10 of the present embodiment includes a planar-type gate structure. As another embodiment, however, the semiconductor device 10 may include a trench-type gate structure.

The semiconductor substrate 12 includes a first portion 22, 24, 26, 28 constituted of GaN (gallium nitride), and a second portion 30 constituted of AlN (aluminum nitride). It should be noted that the material of the second portion 30 is not limited to AlN as mentioned later, and the second portion 30 may be constituted of $Al_xGa_{(1-x)}N$ (0<x≤1). The first portion 22, 24, 26, 28 includes an n-type source region 22, an n-type drain region 24, a p-type body region 26, and an n-type drift region 28. The n-type region herein is a region doped with n-type impurities, and means a semiconductor region where electrons act as majority carriers. Moreover, the p-type region herein is a region doped with p-type impurities, and means a semiconductor region where holes act as majority carriers.

The source region 22 is disposed at the upper surface 12a of the semiconductor substrate 12, and is in contact with the source electrode 14. The source region 22 has a sufficiently high impurity density, and the source electrode 14 is in ohmic contact with the source region 22. As an example, the source region 22 is located at a corner portion of the mesa portion 12m, and the source electrode 14 is in contact with the source region 22 in two directions. In other words, a trench contact structure is configured. The drain region 24 is disposed at the lower surface 12b of the semiconductor substrate 12, and is in contact with the drain electrode 16. The drain region 24 has a sufficiently high impurity density and the drain electrode 16 is in ohmic contact with the drain region 24.

The body region 26 intervenes between the source region 22 and the drift region 28, and the drift region 28 intervenes between the body region 26 and the drain region 24. In other words, the body region 26 separates the source region 22 and the drift region 28 from each other, and is in contact with each of the source region 22 and the drift region 28. The drift region 28 separates the body region 26 and the drain region 24 from each other, and is in contact with each of the body region 26 and the drain region 24. The body region 26 and the drift region 28, along with the source region 22, are disposed at the upper surface 12a of the semiconductor substrate 12. The gate electrode 18 faces a part of the body region 26 extending between the source region 22 and the drift region 28 at the upper surface 12a of the semiconductor substrate 12, via the gate insulator film 20. Moreover, the body region 26 is in contact with the source electrode 14 as well in the trench portion 12t at the upper surface 12a of the semiconductor substrate 12.

With the above-described configuration, when a drive voltage is applied to between the gate electrode 18 and the source electrode 14, an n-type channel C that extends between the source region 22 and the drift region 28 is formed in the body region 26. Consequently, electrical conduction is established between the source electrode 14 and the drain electrode 16. In other words, the first portion 22, 24, 26, 28 of the semiconductor substrate 12 forms a MOSFET together with the gate electrode 18 and the gate insulator film 20. The MOSFET is turned on when the drive voltage is applied to between the gate electrode 18 and the source electrode 14. Additionally, two of the body regions 26 that are adjacent to each other and a part 28a of the drift region 28 located between the two body regions 26 form a JFET (Junction Gate Field-Effect Transistor) structure, and it improves voltage resistance of the semiconductor device 10. In other words, the semiconductor device 10 is configured such that, when the MOSFET in the semiconductor device 10 is turned on and a reverse bias voltage is applied to a pn junction surface between the body region 26 and the drift region 28, the part 28a of the drift region 28 located between the two body regions 26 is quickly depleted.

In the first portion 22, 24, 26, 28 of the semiconductor substrate 12, a pn junction-type diode is formed by the body region 26, the drift region 28, and the drain region 24, between the source electrode 14 and the drain electrode 16. This diode allows a current that flows from the source electrode 14 to the drain electrode 16, and inhibits a current that flows from the drain electrode 16 to the source electrode 14. The diode is connected in parallel with the MOSFET mentioned above, and can function as a freewheeling diode.

The semiconductor device 10 of the present embodiment is constituted mainly of GaN. GaN, as well as SiC, is known as a semiconductor material that has a wide band gap larger than a wide band gap of Si. Such a semiconductor material is referred to as a wide-band-gap semiconductor, and has many characteristics superior to characteristics of Si. However, when GaN is compared with SiC, GaN has a thermal conductivity lower than a thermal conductivity of SiC. Therefore, in a conventional semiconductor device that includes GaN, when its semiconductor substrate (i.e., GaN) generates heat due to energization, the heat in the semiconductor substrate is less likely to be dissipated sufficiently, as a result of which the semiconductor substrate may be overheated. To prevent overheating of the semiconductor substrate, a possible measure is to restrict a current flowing through the semiconductor substrate. Such a measure, however, fails to exploit full advantage of GaN (e.g., loss reduction due to a decrease in size of the drift region).

In the respect described above, in the semiconductor device 10 of the present embodiment, the semiconductor substrate 12 includes not only the first portion 22, 24, 26, 28 constituted of GaN, but also the second portion 30 constituted of AlN. A part or an entirety of the second portion 30 constitutes a barrier region 30 to be described later. The barrier region 30 is in contact with each of the source electrode 14, the body region 26, and the drift region 28. AlN that constitutes the barrier region 30 is undoped AlN which is not doped with impurities, and has a sufficient electrical-insulating property in the semiconductor device 10.

Figure 2:
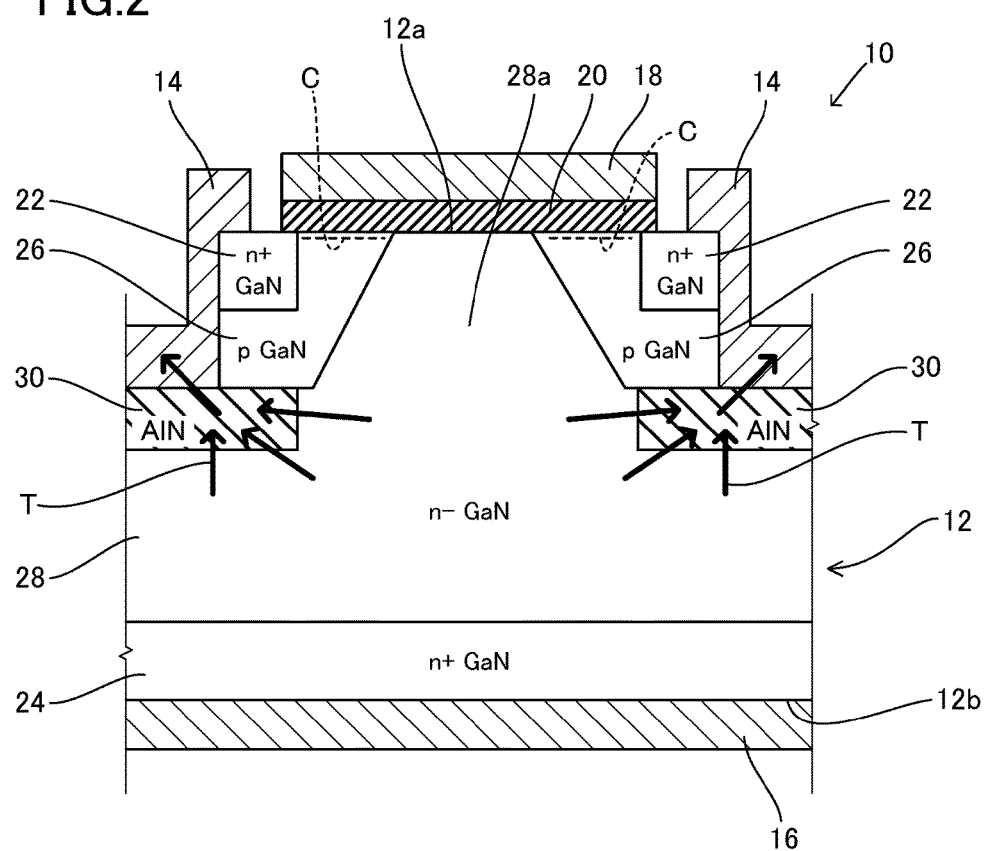
FIG. 2 schematically shows heat dissipation from a drift region 28 through a barrier region 30.

In the semiconductor substrate 12, heat generation accompanying energization is mainly caused in the drift region 28. Accordingly, in order to prevent or suppress overheating of the semiconductor substrate 12, heat generated in the drift region 28 needs to be quickly dissipated to an outside of the semiconductor substrate 12. In this respect, since the barrier region 30 is in contact with both of the source electrode 14 and the drift region 28, the source electrode 14 and the drift region 28 are thermally connected via the barrier region 30. AlN that constitutes the bather region 30 has a thermal conductivity higher than a thermal conductivity of GaN that constitutes the source region 22 and the body region 26. For example, GaN has a thermal conductivity of 1.30 W/(cm·K), whereas AlN (i.e., x=1) has a thermal conductivity of 2.85 W/(cm·K). Accordingly, as shown in FIG. 2, the heat generated in the drift region 28 is quickly transferred to the source electrode 14 through the barrier region 30, and is dissipated to the outside of the semiconductor substrate 12. Here, a plurality of arrows T in FIG. 2 schematically shows a flow of the heat, for reference.

The material of the second portion 30 (i.e., the barrier region 30) is not limited to AlN, and may be $Al_xGa_{(1-x)}N$ (0<x≤1). $Al_xGa_{(1-x)}N$ has a thermal conductivity higher than the thermal conductivity of GaN, and hence it can promote heat dissipation from the drift region 28 to the source electrode 14, similarly to AlN as mentioned above. $Al_xGa_{(1-x)}N$ with a higher content rate of Al has a higher thermal conductivity. Accordingly, in order to enhance a heat-dissipating performance by the barrier region 30, it is preferable to increase the content rate of Al in the barrier region 30, and AlN (i.e., x=1) is more preferable. Additionally, $Al_xGa_{(1-x)}N$ (0<x≤1) with a higher content rate of Al has a larger band gap. Accordingly, by increasing the content rate of Al in the barrier region 30, an insulating property of the barrier region 30 can also be enhanced.

$Al_xGa_{(1-x)}N$ includes a same crystal structure as a crystal structure of GaN. Accordingly, the second portion 30 constituted of $Al_xGa_{(1-x)}N$ is easily formed, together with the first portion 22, 24, 26, 28 constituted of GaN, in the same semiconductor substrate 12. As an example, the second portion 30 (i.e., the barrier region 30) can be formed on the drift region 28 constituted of GaN by epitaxial growth. Moreover, on the second portion 30 (i.e., the barrier region 30), the body region 26 constituted of GaN can be loaned by epitaxial growth. It should be noted, although not particularly limited, the source region 22 and the drift region 28 can be formed by epitaxial growth and etching.

Figure 3:
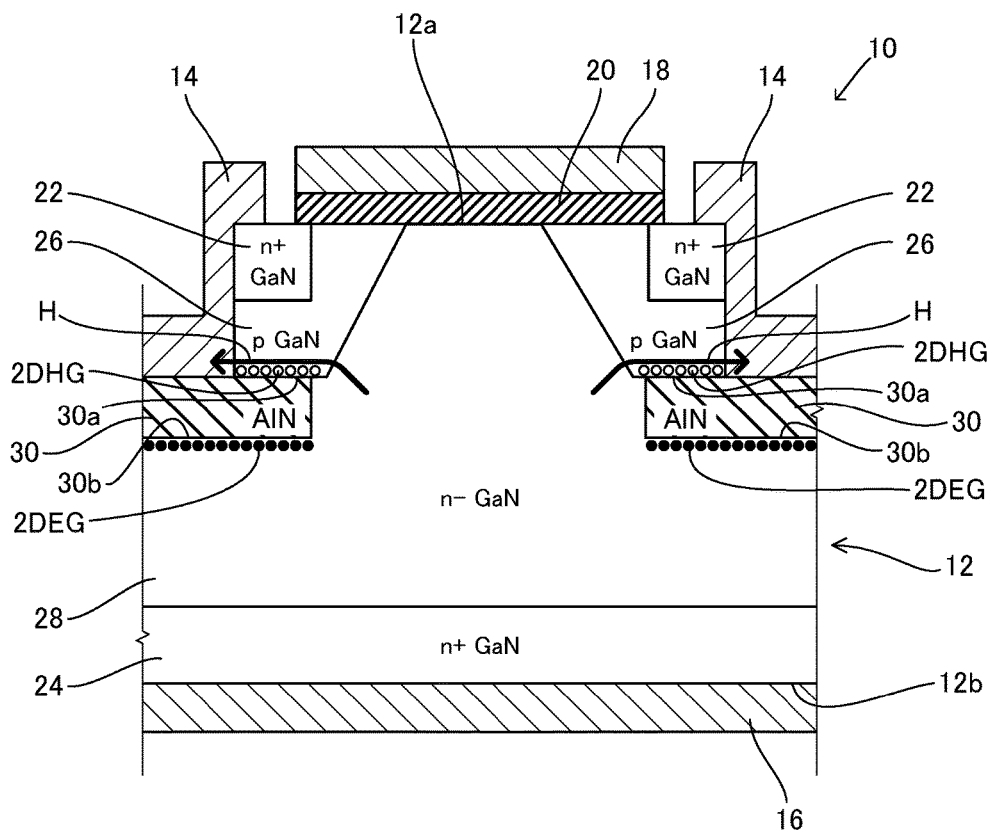
FIG. 3 schematically shows discharge of holes from the drift region 28 through a two-dimensional hole gas 2DHG.

Additionally, as shown in FIG. 3, in the semiconductor device 10 of the present embodiment, a two-dimensional hole gas 2DHG is generated at an interface 30a between the barrier region 30 constituted of MN and the body region 26 constituted of p-type GaN. The interface 30a between the barrier region 30 and the body region 26 continuously extends from the drift region 28 to the source electrode 14. When a high electric field is applied to the drift region 28, impact ionization occurs in the drift region 28, and holes and free electrons are generated. The generated holes and free electrons become a factor that causes another impact ionization, and if an avalanching increase in impact ionization occurs, the semiconductor device 10 is brought into a state of avalanche breakdown. In the semiconductor device 10 of the present embodiment, however, when impact ionization occurs in the drift region 28, holes generated by the impact ionization are quickly discharged to the source electrode 14 through the two-dimensional hole gas 2DHG. Thereby, the avalanching increase in impact ionization is suppressed, and hence an avalanche resistance of the semiconductor device 10 is improved. A plurality of arrows H in FIG. 3 schematically shows a flow of the holes, for reference.

Not limited to the case where the barrier region 30 is constituted of AlN, the two-dimensional hole gas 2DHG mentioned above is generated similarly in a case where the barrier region 30 is constituted of (0<x≤1) (0<x≤1), as well. In other words, so long as the barrier region 30 is constituted of $Al_xGa_{(1-x)}N$ (0<x≤1), the avalanche resistance of the semiconductor device 10 is improved.

Furthermore, as shown in FIG. 3, in the semiconductor device 10 of the present embodiment, a two-dimensional electron gas 2DEG is generated at an interface 30b between the barrier region 30 constituted of AlN and the drift region 28 constituted of n-type GaN. Electron mobility is higher in the two-dimensional electron gas 2DEG than at least in the drift region 28. Therefore, when the MOSFET in the semiconductor device 10 is turned on and electrons flow from the source electrode 14 to the drain electrode 16 through the drift region 28, an energy loss caused in the drift region 28 is reduced. Accordingly, an on-resistance of the semiconductor device 10 is reduced, and an amount of heat generated in the semiconductor substrate 12 is also reduced.

Not limited to the case where the barrier region 30 is constituted of AlN, the two-dimensional electron gas 2DEG mentioned above is generated similarly in the ease where the harrier region 30 is constituted of $Al_xGa_{(1-x)}N$ (0<x≤1), as well. In other words, so long as the barrier region 30 is Constituted of $Al_xGa_{(1-x)}N$ (0<x≤1), the on-resistance of the semiconductor device 10 is reduced, and the amount of heat generated in the semiconductor substrate 12 is also reduced.

What is claimed is:

1. A semiconductor device comprising:
   a semiconductor substrate comprising a nitride semiconductor;
   a source electrode and a drain electrode each disposed on the semiconductor substrate; and
   a gate electrode disposed on the semiconductor substrate via a gate insulator film,
   wherein
   the semiconductor substrate comprises a first portion constituted of GaN and a second portion constituted of $Al_xGa_{(1-x)}N(0<x≤1)$,
   the first portion comprises an n-type source region being in contact with the source electrode, an n-type drain region being in contact with the drain electrode, a p-type body region intervening between the source region and the drain region and being in contact with the source electrode, and an n-type drift region intervening between the body region and the drain region and having a carrier density that is lower than a carrier density of the drain region, and
   the second portion comprises a barrier region being in contact with each of the source electrode, the body region and the drift region; wherein
   the semiconductor substrate comprises a first surface at which each of the source region, the body region and the drift region is disposed, and
   the gate electrode faces a part of the body region extending between the source region and the drift region at the first surface via the gate insulator film.

2. The semiconductor device according to claim 1, wherein the $Al_xGa_{(1-x)}N$ is AlN.

3. The semiconductor device according to claim 1, wherein
   the semiconductor substrate comprises a second surface at which the drain region is disposed, and being located opposite to the first surface, and
   the source electrode is disposed on the first surface and the drain electrode is disposed on the second surface.

4. The semiconductor device according to claim 1, wherein the body region is in contact with both the source region and the drift region at the first surface of the semiconductor substrate.

5. The semiconductor device according to claim 1, wherein the drift region is in contact with the gate insulator film at the first surface of the semiconductor substrate.

6. The semiconductor device according to claim 1, wherein the drift region is not in contact with the source electrode.

* * * * *